United States Patent
Losee et al.

(10) Patent No.: US 10,541,300 B2
(45) Date of Patent: Jan. 21, 2020

(54) SEMICONDUCTOR DEVICE AND METHOD OF MAKING THEREOF

(71) Applicant: GENERAL ELECTRIC COMPANY, Schenectady, NY (US)

(72) Inventors: Peter Almern Losee, Clifton Park, NY (US); Alexander Viktorovich Bolotnikov, Niskayuna, NY (US); Yang Sui, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 15/164,928

(22) Filed: May 26, 2016

(65) Prior Publication Data

US 2017/0345890 A1 Nov. 30, 2017

(51) Int. Cl.
    *H01L 29/06* (2006.01)
    *H01L 29/78* (2006.01)
    *H01L 29/16* (2006.01)
    *H01L 21/761* (2006.01)
    *H01L 29/10* (2006.01)
    *H01L 29/66* (2006.01)

(52) U.S. Cl.
    CPC ........ *H01L 29/0623* (2013.01); *H01L 21/761* (2013.01); *H01L 29/1095* (2013.01); *H01L 29/1608* (2013.01); *H01L 29/66068* (2013.01); *H01L 29/7811* (2013.01)

(58) Field of Classification Search
    None
    See application file for complete search history.

(56) References Cited

U.S. PATENT DOCUMENTS

| 5,914,499 A | 6/1999 | Hermansson et al. |
| 6,621,121 B2 | 9/2003 | Baliga |

(Continued)

FOREIGN PATENT DOCUMENTS

| JP | 2004319815 A | 11/2004 |
| WO | 199711497 A1 | 3/1997 |
| WO | 2010001201 A1 | 1/2010 |

OTHER PUBLICATIONS

Weiss, R. et al., "Different Ion Implanted Edge Terminations for Schottky diodes on SiC", Ion Implantation Technology, 2002. IEEE, Proceedings of the 14th International Conference, pp. 139-142, Sep. 22-27, 2002.

(Continued)

*Primary Examiner* — Steven B Gauthier
(74) *Attorney, Agent, or Firm* — Fletcher Yoder, P.C.

(57) ABSTRACT

Embodiments of a semiconductor device and methods of forming thereof are provided herein. In some embodiments, a power semiconductor device may include a first layer having a first conductivity type; a second layer disposed atop the first layer, the second layer having the first conductivity type; a termination region formed in the second layer, the termination region having a second conductivity type opposite the first type; and an active region at least partially formed in the second layer, wherein the active region is disposed adjacent to the termination region proximate a first side of the termination region and wherein the second layer is at least partially disposed adjacent to the termination region proximate a second side of the termination region opposite the first side.

28 Claims, 6 Drawing Sheets

(56) References Cited

U.S. PATENT DOCUMENTS

| | | | |
|---|---|---|---|
| 7,144,797 | B2 | 12/2006 | Chow et al. |
| 7,345,342 | B2 | 3/2008 | Challa et al. |
| 8,637,386 | B2 | 1/2014 | Zhang et al. |
| 8,790,981 | B2 | 7/2014 | Burgess et al. |
| 8,809,953 | B2 | 8/2014 | Fried et al. |
| 8,829,533 | B2 | 9/2014 | Domeij |
| 2010/0289032 | A1* | 11/2010 | Zhang ............. H01L 21/0465 257/77 |
| 2012/0097980 | A1 | 4/2012 | Masuda et al. |
| 2013/0140584 | A1* | 6/2013 | Kameshiro ........... H01L 29/861 257/77 |
| 2013/0140633 | A1 | 6/2013 | Pattanayak |
| 2013/0285071 | A1* | 10/2013 | Kameshiro ......... H01L 29/0615 257/77 |
| 2015/0179441 | A1* | 6/2015 | Onozawa ............. H01L 29/36 257/109 |
| 2015/0287817 | A1 | 10/2015 | Kubota et al. |

OTHER PUBLICATIONS

Qin et al., "Ambient-controlled scanning spreading resistance microscopy (AC-SSRM) profiling study of advanced doping technologies", IEEE, Junction Technology (IWJT) vol. 2, 2014 International Workshop on, pp. 1-4, May 18-20, 2014.

International search report and written opinion issued in connection with with PCT Patent Application No. PCT/US2017029066 dated Jul. 26, 2017.

PCT/US2017/029066 Search Report and Written Opinion, dated Aug. 21, 2017.

\* cited by examiner

SEMICONDUCTOR DEVICE AND METHOD OF MAKING THEREOF

BACKGROUND

The subject matter disclosed herein relates to semiconductor devices and, more particularly, to silicon carbide (SiC)-based semiconductor devices.

Breakdown voltage of a reverse-blocking junction is a factor that limits the reverse voltage a semiconductor device can withstand. A breakdown voltage close to its ideal limit (e.g., about 90%) is a critical performance metric for power devices, particularly high-voltage devices such as silicon carbide devices. However, avalanche breakdown can occur in such devices at a voltage substantially less than the ideal breakdown voltage because of excessively high electric fields that are present at high field points throughout the device. For example, a high field point of a blocking junction under reverse bias may occur near (e.g., at) a metallurgical junction along a region of curvature, such as at the edge of unterminated junctions.

Conventional devices may include termination regions or termination structures (e.g., JTE (junction termination extension)) to mitigate the localization of high electric fields by laterally extending the depletion region away from the edges of the active regions, thereby increasing a voltage at which the breakdown may occur. However, such termination structures are dopant sensitive and require masking or isolation during the fabrication of active area doped regions to prevent an unintentional alteration of the charge distribution in the termination structure and maintain proper blocking voltage. For example, fabrication of regions configured to perform various functions (threshold voltage adjustment regions, current spreading layers, barrier regions, or the like) within the active areas of the device require masking and etching steps and are likewise limited to low energy implants to prevent dopants from unintentionally impinging on the termination structure. Moreover, conventional doping schemes used to optimize the active area of the power device are typically incompatible with the termination regions.

Therefore the inventors have provided an improved semiconductor device and method of making thereof.

BRIEF DESCRIPTION

Embodiments of a semiconductor device and methods of forming thereof are provided herein. In some embodiments, a power semiconductor device may include a first layer having a first conductivity type; a second layer disposed atop the first layer, the second layer having the first conductivity type; a termination region formed in the second layer, the termination region having a second conductivity type opposite the first type; and an active region at least partially formed in the second layer, wherein the active region is disposed adjacent to the termination region proximate a first side of the termination region and wherein the second layer is at least partially disposed adjacent to the termination region proximate a second side of the termination region opposite the first side.

In some embodiments, a semiconductor device may include a first layer having a first conductivity type; a second layer disposed atop the first layer, the second layer having the first conductivity type, wherein a dopant concentration profile of an average dopant concentration within the second layer as measured from a surface of the second layer to a given depth of the second layer comprises a retrograde profile; and a termination region formed in the second layer, the termination region having a second conductivity type opposite the first type, wherein the average dopant concentration of the second layer is greater than an average dopant concentration of the first layer.

In some embodiments, a method for forming a semiconductor device may include forming a first layer having a first conductivity type atop a substrate; forming a second layer having the first conductivity type atop the first layer via a blanket fabrication process; doping the second layer such that an average dopant concentration of the second layer is greater than an average dopant concentration of the first layer; and forming a termination area doped region in the second layer, the termination area doped region having a second conductivity type opposite the first type.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Embodiments of a semiconductor device and methods of forming thereof are provided herein. In at least some embodiments, the inventive semiconductor device and method may advantageously provide a high voltage semiconductor device having a comparatively high breakdown voltage while allowing for an improvement in performance of an active region of the device. Moreover, such advantages may be realized without the additional processing steps of masking and patterning typically needed to isolate a termination region during conventional fabrication, thereby providing a simplified fabrication without sacrificing performance.

Although described in the context of a metal-oxide-semiconductor field-effect transistor (MOSFET) having a particular configuration, the inventive semiconductor device and method described herein may be applicable to any semiconductor device, power semiconductor device or related configurations, for example such as, a junction field-effect transistor (JFET), insulated-gate bipolar transistor (IGBT), junction barrier Schottky (JBS) diode, merged PiN Schottky (MPS) diode, or the like. In some embodiments, the inventors have observed that the inventive concepts described herein may be advantageous in applications such as silicon carbide (SiC) related power semiconductor devices.

Figure 1:
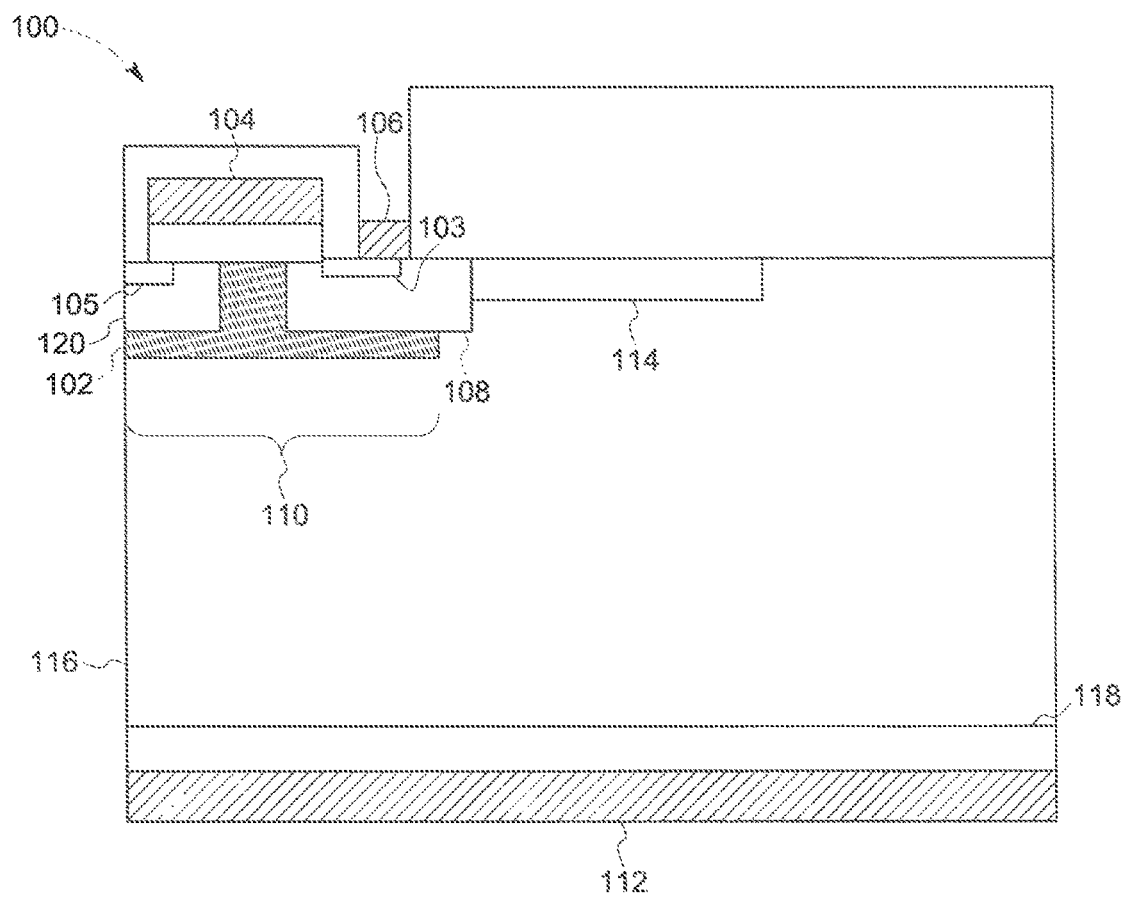
FIG. 1 illustrates a cross-sectional view of a conventional semiconductor or metal oxide semiconductor (MOS) device.

FIG. 1 illustrates an exemplary conventional semiconductor device (device or power semiconductor device) 100. The device 100 generally includes a substrate 118 having a contact (e.g. drain, cathode, etc.) 112, one or more layers (e.g., drift layer 116 shown) disposed atop the substrate 118 and one or more structures (e.g., gate 104 and source 106 shown) disposed atop the one or more layers/regions. An additional layer, for example an optimization layer 102 (a threshold adjust layer, current spreading layers, JFET doping layer, p-barrier layer, or the like), is formed within the drift layer 116 beneath the gate 104 and source 106. The inventors have observed that the additional charge associated with an optimization layer may, for example, allow for a reduction in on-resistances for the overall device and/or allow for an efficient scaling to higher voltages while maintaining optimized small pitch devices, thereby reducing cost and improving performance of the devices.

In addition, at least partially formed in the drift layer 116 and/or the optimization layer 102 are one or more well regions (e.g., two well regions 108, 120 and two nested n+ source regions 103, 105 shown). The drift layer 116 further includes a termination region 114 formed within the drift layer 116 and adjacent to the wells 108, 120.

The inventors have observed that in conventional device configuration and fabrication, termination structures (e.g., termination region 114 or structures formed using such a region) are dopant sensitive. That is, an unintentional alteration of the doped regions may have a negative effect on the ability of the termination structure to reduce electric fields within desired locations of the underlying device layers, thereby potentially decreasing a breakdown voltage of the entire device. As such, conventional device fabrication processes and configuration requires the masking or isolation of the termination region from other selectively doped portions of the device to avoid such an alteration of the dopant profile.

For example, as can be seen in FIG. 1, the optimization layer 102, wells 108, 110, gate 104 and source 103,105 are confined within an active area or active region 110 of the device 100 and the termination region 114 disposed outside of the active area 110. Such a configuration allows for isolation of the termination region 114, thereby reducing instances of unintentional doping of the termination region 114. As used herein, the active region 110 may be defined as a region of the semiconductor device 100) which facilitate desired functions controlled conduction or switching on/off of the semiconductor device.

To achieve the above described isolation of the termination region 114, conventional device fabrication processes require multiple deposition, patterning, and etch steps. For example, the formation of the active region 110 typically requires multiple depositions of, for example, material layers (e.g., silicon, silicon carbide, oxides, or the like) diffusion, implant or etch masks, followed by subsequent etch processes (e.g., wet etch, mesa etch, or the like).

Figure 2:
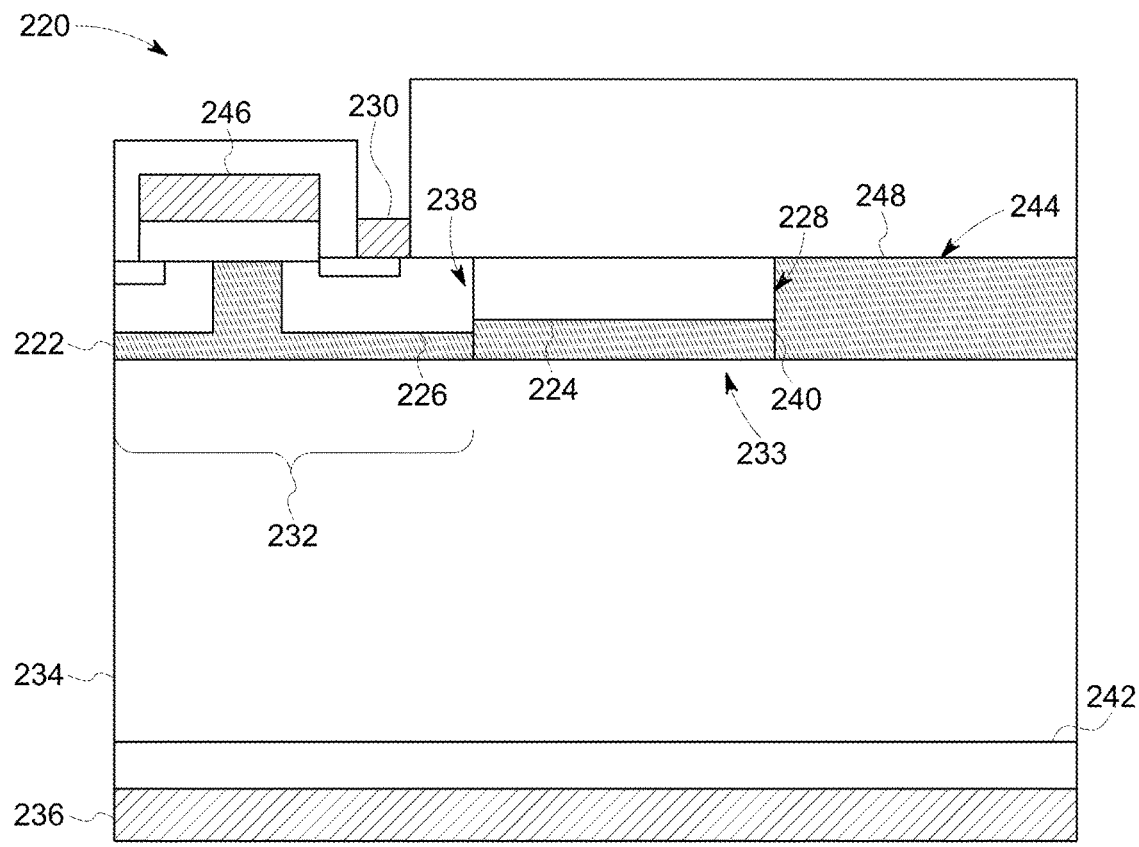
FIG. 2 illustrates a cross-sectional view of a semiconductor MOS device in accordance with some embodiments of the present invention.

Referring to FIG. 2, the semiconductor device 220 may generally comprise a first layer 234, a second layer 222 disposed above the first layer 234, and a termination region 233 and an active area or active region 232 each at least partially formed in the second layer 222. In some embodiments, one or more structures (e.g., gate 246 and source contact 230 shown) may be disposed above the first layer 234 and second layer 222. In some embodiments, a substrate 242 having a contact (e.g. drain, cathode, etc.) 236 may be disposed beneath the first layer 234. When present, the substrate 242 may be any type of substrate and comprised of any materials suitable for an intended application of the device 220. For example, in some embodiments, the substrate 242 may be a silicon (Si) or silicon carbide (SiC) containing substrate.

The termination region 233, active region 232 and second layer 222 may be disposed with respect to one another in any manner suitable for an intended application of the device 220. For example, in some embodiments, the second layer 222 may extend from the active region 232 at least partially, or in some embodiments fully, across the device 220 to an area 244 beyond an opposing side of the termination region 233. For example, in such embodiments, the active region 232 may be disposed adjacent to the termination region 233 proximate a first side 238 of the termination region 233 and the second layer 222 is at least partially disposed adjacent to the termination region 233 proximate a second side 228 of the termination region 233 opposite the first side 238.

The inventors have observed that extending the second layer 222 at least partially across the device 220 allows for both the separate functional regions of the device to operate properly, for example, the active region 232 and termination region 233, to be fabricated without the additional processing steps of masking and patterning typically required to isolate the second layer 222 from the termination region or structure in conventional device fabrication processes (e.g., as described above). For example, the second layer 222 may be formed via a blanket deposition and/or doping process (e.g., a deposition process without the use of etch or patterning masks, subsequent etch processes related to such masks, or the like).

The first layer 234 and second layer 222 each may be any type of layer suitable for device 220 construction and may be dependent on an intended application of the device 220. For example, in some embodiments, the first layer 234 may be a drift layer, barrier layer, buffer layer, or the like. In another example, in some embodiments, the second layer 222 may be an optimization layer, threshold adjust layer, JFET layer, current spreading layer (CSL), hole barrier layer, or the like.

Each of the first layer 234 and second layer 222 may be formed via any suitable fabrication process, for example, deposition, epitaxial growth, or the like. In addition, in some embodiments, the second layer 222 may be formed from at least a portion of the first layer 234. For example, in such embodiments, at least a portion of the first layer 234 may be selectively doped to a desired depth to form the second layer 222.

Each of the first layer 234 and second layer 222 may be fabricated from any materials suitable for an intended application of the device 220 and may be fabricated from similar materials, or in some embodiments, different materials. For example, in some embodiments, each of the first layer 234 and second layer 222 may comprise silicon (Si), silicon carbide (SiC), or the like.

The active area 232 generally includes one or more structures configured to facilitate the desired functions of the semiconductor device (e.g., voltage blocking, switching, or the like). For example, in some embodiments, the active area 232 may include a well or body (collectively well 226), the gate 246, source contact 230, or the like.

The termination region 233 may include or more termination structures 224 suitable to provide a desired blocking voltage. For example, in some embodiments, the termination region 233 may include a floating guard ring, junction termination extension (JTE) structure (e.g., single-zone JTE, multiple zone JTE, space modulated JTE, or the like), or the like. Although shown as extending partially through the second layer 222, the termination region may extend substantially through, or in some embodiments, completely through, the second layer 222 to the first layer 234, for example such as shown at 240.

The first layer 234, second layer 222 and termination region 233 may be doped relative to one another in any manner suitable to fabricate the device 220 while maintaining desired performance of the device 220. For example, in some embodiments, the first layer 234, second layer 222 and termination region 233 may each comprise a dopant having a sufficient dopant concentration such that each of the first layer 234 and second layer 222 are of the same conductivity type (e.g., n-type or p-type) and the termination region 233 is of an opposite conductivity type (e.g., n-type or p-type) compared to that of the first layer 234 and second layer 222. In such embodiments, the dopant concentration or average dopant concentration of the second layer 222 may be higher than that of the first layer 234. For example, in some embodiments, a dopant concentration or average dopant concentration of the second layer 222 may be between about two (2) times to about fifteen (15) times greater than that of the first layer 234. In one exemplary embodiment of the relative doping described above, the first layer 234 and second layer 222 may each comprise an n-type conductivity and the termination region a p-type conductivity.

The inventors have observed that the above described relative doping of the first layer 234, second layer 222 and termination region 233 allows for the second layer 222 to be formed via a deposition, implantation or diffusion process (e.g., a blanket deposition, implant or diffusion process) while eliminating the need for additional processing steps (e.g., masking, patterning and etching steps) that are typically required to isolate the termination region during conventional device fabrication, thereby providing a device 220 that may be fabricated in a comparatively simpler and/or efficient process while maintaining desired performance characteristics of the device 220 (e.g., a high breakdown voltage). Moreover, such a fabrication process may allow for the utilization of high-energy implantations, thereby providing deep range doping profiles without the need for conventionally high cost high-stopping power masking layers (e.g., such as metal or thick-oxide hardmasks).

Although shown as a contiguous layer in FIG. 2, the termination region 233 may be non-continuous and/or include a plurality of discrete or separated regions (e.g., segmented). For example, referring to FIG. 3, in some embodiments the semiconductor device (device) 300 may comprise a termination region 320 having a termination structure, for example a JTE, which includes a plurality of discrete doped regions 321. The regions 321 may be of any size and distribution suitable to provide a desired dopant profile across the termination region 320 and may be dependent on process capabilities, a desired dopant profile, or the like.

In some embodiments, the device 300 may include one or more layers, for example such as a first layer 314 and second layer 318 (e.g., similar to the first layer 234 and second layer 222 described above) disposed above a substrate 302 (e.g., similar to the substrate 242 described above). One or more regions, for example, an active region 336 having a well or body (collectively well 316) may be formed in the second layer 318. When present, the active region 336 and well 316 may be similar in structure and function to the active area 232 and well 226 described above.

The active region 336 and termination region 320 may be disposed with respect to one another in any manner suitable to achieve desired performance characteristics of the device 300. For example, in some embodiments, the well 316 of the active region 336 may be disposed adjacent to, or in direct contact with, one or more of the regions 321. Alternatively or on combination, in some embodiments, a portion of the second layer 318 may be disposed between at least a portion of the well 316 and one or more of the regions 321 (e.g., such as shown in phantom at 360).

The first layer 314, second layer 318 and termination region 320 may be doped relative to one another in any manner suitable to fabricate the device 300 while maintaining desired performance of the device 300, for example, such as described above with respect to the first layer 234, second layer 222 and termination region 233 of FIG. 2.

Within the termination region 320, the discrete regions 321 may be similarly doped with respect to dopant type and concentration, or alternatively, may comprise varying dopant concentrations across the termination region 320. For example, in some embodiments, the discrete regions 321 may be doped so as to have an effective doping profile that generally decreases along a direction away from an edge 330 of termination region 320. In some embodiments, the decrease in doping concentration may be a macro-variation such that the dopant concentration within each discrete region 321 is consistent, but the spacing between the doped regions varies, thereby decreasing the overall dopant concentration as the distance away from the edge 330 increases. It should be noted that by "varying concentration", it is meant that the dopant amount or density of the regions varies, and it is this variance that defines the effective dose. As used here, "effective dose" is the fraction of the termination region 320 area that is open to receive the dopants (implants) versus a total area being sampled.

In any of the above embodiments, the second layer (e.g., second layer 222 of FIG. 2 or second layer 318 of FIG. 3) may comprise any dopant profile suitable to allow for the simultaneous desired performance of both the active region and termination region (a "compensated termination design"). For example, in some embodiments, a depth and doping of the second layer within the termination region (e.g., termination region 232 of FIG. 2 or termination region 320 of FIG. 3) may be such that a total integrated net n-type dopant charge located beneath the termination region (and second layer in embodiments where the second layer is at least partially disposed beneath the termination region) is limited by a critical charge of the material utilized (e.g., a sheet doping concentration of about $1.1 \times 10^{13}$ cm$^{-2}$ in embodiments where SiC is utilized). In such embodiments, a sheet doping concentration within the second layer may be between about $2 \times 10^{12}$ cm$^{-2}$ and about $8 \times 10^{12}$ cm$^{-2}$.

Figure 3:
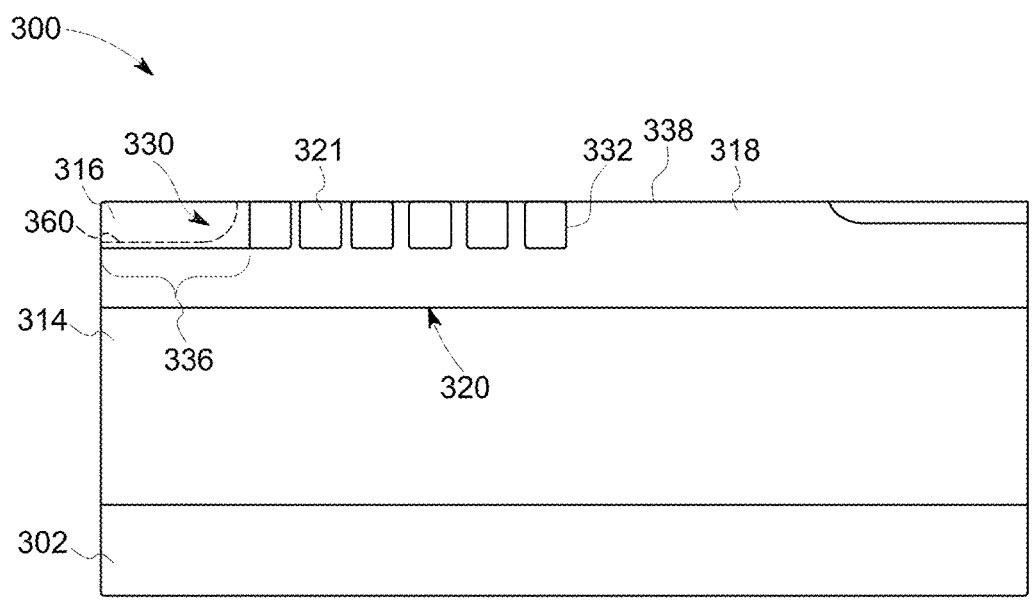
FIG. 3 illustrates a cross-sectional view of a semiconductor device in accordance with some embodiments of the present invention.

In some embodiments, a dopant concentration proximate a surface of the second layer (surface or top surface of second layer 222 and 318 shown at 238 in FIGS. 2 and 338 in FIG. 3, respectively) is less than a dopant concentration at depths further away from the surface. For example, an average dopant concentration at a depth of at least 0.2 μm from the surface of the second layer may be at least four (4) times greater than that of an average dopant concentration at the surface of the second layer. In another example, a doping concentration proximate or at the surface of the second layer may be about $8 \times 10^{15}$ $cm^{-3}$ to about $2 \times 10^{16}$ $cm^{-3}$, or in some embodiments, an average dopant concentration of up to about $1 \times 10^{16}$ $cm^{-3}$, and an average dopant concentration at a depth greater than about 0.2 μm from the surface into the second layer may be about $5 \times 10^{16}$ $cm^{-3}$ to about $1 \times 10^{17}$ $cm^{-3}$. In any of the above embodiments, a sheet doping concentration in the second layer within an area defined as between the surface of the second layer to a depth of about 1.5 μm may be between about $2 \times 10^{12}$ $cm^{-2}$ to about $5 \times 10^{12}$ $cm^{-2}$. Any of the above described concentrations may be implemented via a profile, wherein the concentration increases from the surface to the depth in the second layer using, for example, an implanted process or with a "stepwise" profile having an increasing doping concentration of distinct epitaxial layers.

Figure 4:
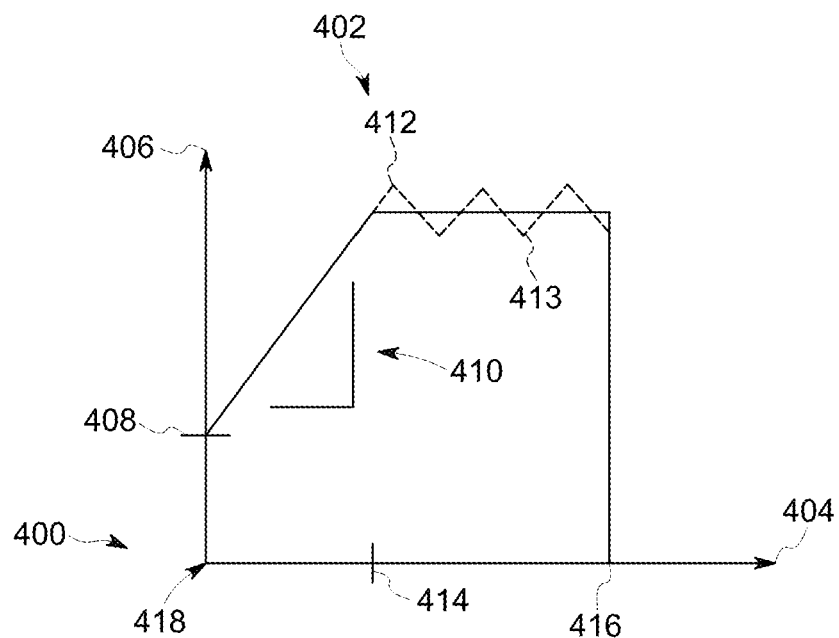
FIG. 4 illustrates an exemplary dopant profile for at least a portion of the semiconductor device depicted in FIGS. 2 and 3 in accordance with some embodiments of the present invention.

For example, FIG. 4 illustrates a graph 400 of one such dopant profile of the second layer. Specifically, the graph 400 schematically depicts a retrograde dopant profile 402 of the second layer, shown as a function of a dopant concentration (y-axis) 406 and depth (x-axis) 404 of the second layer.

As illustrated, in some embodiments, a dopant concentration of the second layer may increase from a first dopant concentration 408 proximate the surface (indicated graphically at 418) to a peak dopant concentration 412 at a first depth 414 of the second layer, thereby giving a retrograde dopant profile 402. As the depth increases from the first depth 414, the dopant concentration may remain approximately constant, or alternatively, vary or oscillate about the peak dopant concentration 412 (as shown at 413) until a maximum depth 416, where it then decreases to reach the doping concentration of the first layer (e.g., first layer 234, 314). The maximum depth 416 may be any depth up to the thickness of the second layer, for example, such as greater than or equal to a depth of other components or regions of the device (e.g., wells, body, active area, termination area, or the like).

The first dopant concentration 408 may be about $5 \times 10^{15}$ $cm^{-3}$ to about $5 \times 10^{16}$ $cm^{-3}$, or in some embodiments, about $8 \times 10^{15}$ $cm^{-3}$ to about $2 \times 10^{16}$ $cm^{-3}$. The peak dopant concentration 412 may be any dopant concentration that is greater than the first dopant concentration 408. For example, in some embodiments, the peak dopant concentration 412 may be about four (4) to about ten (10) times greater than the first dopant concentration 408.

The depth (first depth 414) at which the peak dopant concentration is reached may be any depth suitable to achieve a desired dopant profile and may be dependent on, for example, a thickness of the second layer, material composition of the second layer and other layers disposed adjacent to the second layer, size shape and placement of other components or regions of the device (e.g., wells, body, active area, termination area, or the like). For example, in some embodiments, a doping concentration of the second layer is less than about 20% of a doping concentration of a well formed in the active area (e.g., well 226 or well 316 described above) at substantially similar depths into the second layer and well region until such a depth where the well region reaches a peak concentration. In another example, in some embodiments, the peak dopant concentration 412 may be reached at depth of about 0.15 um to 0.3 um from the surface of the second layer.

Although the dopant concentration increase is shown as having a constant slope 410, the increase of dopant concentration may be exponential, logarithmic, or the like. In some embodiments, the slope 410 may be dependent on a desired dopant amount as it relates to the dopant profiles of other components of other components or regions of the device (e.g., well 226 or termination region 233 described above, or the like), thereby allowing for an optimal dopant concentration of each component or region simultaneously to achieve a desired performance of the device (e.g., threshold voltage, etc.).

The inventors have observed that the retrograde profile 402 shown in FIG. 4 allows for a maximization of an effective sheet doping concentration of the second layer while minimizing impact on surface doping concentration of other regions in the active and termination regions of the device, thereby allowing for such a maximization (and achieving optimization layer features like reducing on-resistance in devices like JFETs, MOSFETs etc.) without affecting other device parameters (e.g., channel length, threshold voltage, or the like) that depend upon the net dopant concentration at the surface of the second layer and other layers or components (e.g., p-well, p-body, termination, etc.).

Although described in the context of the second layer, any of the regions or components formed within the second layer (e.g., active area 232, well 226 or body formed in the active area 232, termination region 233, or the like) may include similar dopant profiles. For example, in some embodiments, the well 226 (e.g., p-well) formed in the active area 232 may include a retrograde dopant profile similar to that shown in FIG. 4. In such embodiments, the retrograde dopant profile of the well 226 may include a profile such that a dopant concentration that increases by at least five (5) times from a surface of the well region to a depth at which a peak concentration is disposed.

Figure 5:
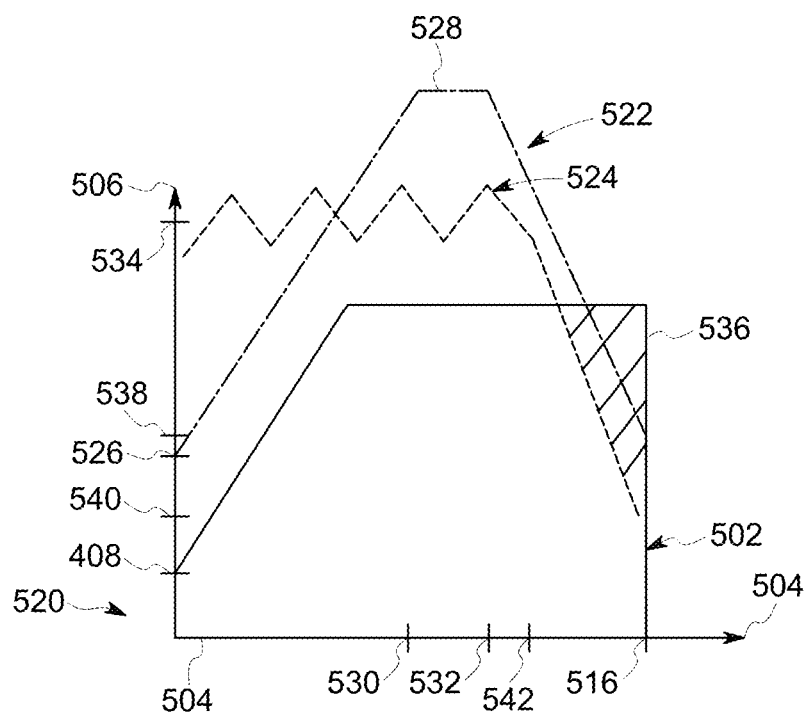
FIG. 5 illustrates an exemplary dopant profile for at least a portion of the semiconductor device depicted in FIGS. 2 and 3 in accordance with some embodiments of the present invention.

In another example, FIG. 5 depicts a retrograde dopant profile 502 of the second layer similar to that described above in addition to possible termination or well regions (e.g., termination region 233 or termination region 320, well region 226, well region 316 described above) dopant profiles (shown at 522 and 524), in accordance with some embodiments of the present invention. Each dopant profile is shown as a function of a dopant concentration (y-axis) 506 and depth (x-axis) 504 of the respective layer or region the dopant profile represents. The retrograde dopant profile 502 is similar, or in some embodiments the same, as the retrograde profile 402 described above and the embodiments thereof.

Each of the retrograde dopant profile 502 of the second layer and dopant profiles 522, 524 of the termination or well region may depict dopant concentrations of an opposing type. For example, in some embodiments, the retrograde dopant profile 502 of the second layer may represent a p-type dopant concentration within the second layer and the dopant profiles 522, 524 of the termination or well regions represent an n-type dopant concentration within the termination region.

In some embodiments, the termination or well region dopant profiles may be a retrograde profile, box-like profile, or the like. For example, in some embodiments, the termination region dopant profile 522 may increase from a first dopant concentration 526 proximate the surface or top surface (indicated graphically at 520) to a peak dopant concentration 528 at a first depth 530 of the termination or well regions, thereby giving a retrograde dopant profile 522. In some embodiments, the peak dopant concentration is higher than the peak concentration (e.g., peak concentration 412, 413 described above) of the second layer. As the depth increases from the first depth 530, the dopant concentration may remain approximately constant, or alternatively, vary or oscillate about the peak dopant concentration 528 until a second depth 532, where it decreases to a second dopant concentration 538 at a maximum depth 516. The maximum depth 516, wherein the second layer doping concentration is proximal to the first layer 234 doping concentration may be any depth up to the thickness of the termination region, for example, such as greater than or equal to a depth of other components or regions of the device (e.g., wells, body, active area, termination area, second layer or the like).

Alternatively, in some embodiments, the termination region dopant profile 524 may remain constant, or oscillate about, a first dopant concentration 534 from proximate the surface 520 to a third depth 542, where it then decreases to a third dopant concentration 540 at the maximum depth 516.

Figure 6:
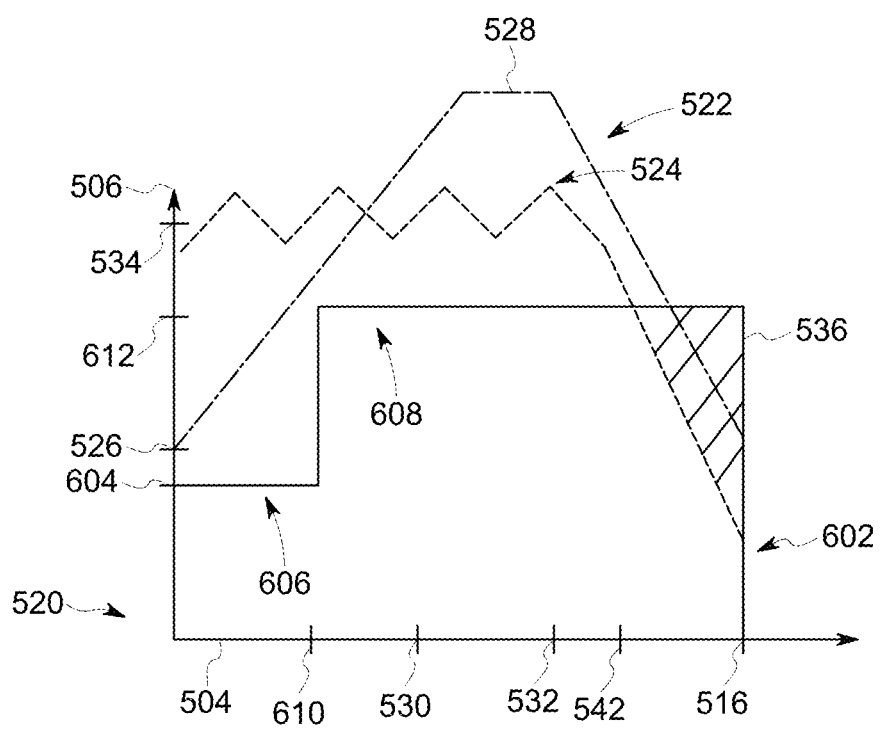
FIG. 6 illustrates an exemplary dopant profile for at least a portion of the semiconductor device depicted in FIGS. 2 and 3 in accordance with some embodiments of the present invention.

Although shown as having a particular shape, in some embodiments the dopant profile of the second layer 402, 502 described above with respect to FIGS. 4 and 5 may at least partially include a "step" like profile including one or more plateaus 606, 608, for example, such as the dopant profile 602 shown in FIG. 6. In such embodiments, the dopant profile 602 may include a first dopant concentration 604 proximate the surface of the second layer (indicated graphically at 520) of the second layer. The first dopant concentration 604 may remain substantially constant to a first depth 610. At the first depth 610, the dopant concentration may increase to a peak dopant concentration 612. As the depth increases from the first depth 610 the dopant concentration may remain approximately constant, or alternatively, vary or oscillate about the peak dopant concentration 612 until the maximum depth 516, where it decreases to the first layer 234 doping concentration.

The first dopant concentration 604 may be about $5 \times 10^{15}$ $cm^{-3}$ to about $5 \times 10^{16}$ $cm^{-3}$, or in some embodiments, about $8 \times 10^{15}$ $cm^{-3}$ to about $2 \times 10^{16}$ $cm^{-3}$. The peak dopant concentration 612 may be any dopant concentration that is greater than the first dopant concentration 604. For example, in some embodiments, the peak dopant concentration 612 may be about four (4) to about ten (10) times greater than the first dopant concentration 604.

The depth (first depth 610) at which the peak dopant concentration is reached may be any depth suitable to achieve a desired dopant profile and may be dependent on, for example, a thickness of the second layer, material composition of the second layer and other layers disposed adjacent to the second layer, size shape and placement of other components or regions of the device (e.g., wells, body, active area, termination area, or the like). For example, in some embodiments, the peak dopant concentration 612 may be reached at depth of about 0.15 um to 0.3 um from the surface of the second layer.

In any of the embodiments described above the depth and doping of the second layer within the termination region may be such that a sheet doping concentration of the first type in the second layer located beneath the termination region of the second type (e.g., in the first layer and second layer in embodiments where the second layer is at least partially disposed beneath the termination region) is limited by a critical charge of the material utilized. For example, in some embodiments, the sheet doping concentration of the first type beneath the termination region may be less than about $1.1 \times 10^{13}$ $cm^{-2}$. In some embodiments, the sheet doping concentration of the portion of the second layer located below the termination region (indicated by the shaded region 536 in FIGS. 5 and 6) may be $5 \times 10^{11}$ $cm^{-2}$ to $5 \times 10^{12}$ $cm^{-2}$. In some embodiments, the sheet doping concentration of the portion of the second layer located below the termination region (indicated by the shaded region 536 in FIGS. 5 and 6) may be $7.5 \times 10^{11}$ $cm^{-2}$ to $1.25 \times 10^{12}$ $cm^{-2}$.

Figure 7:
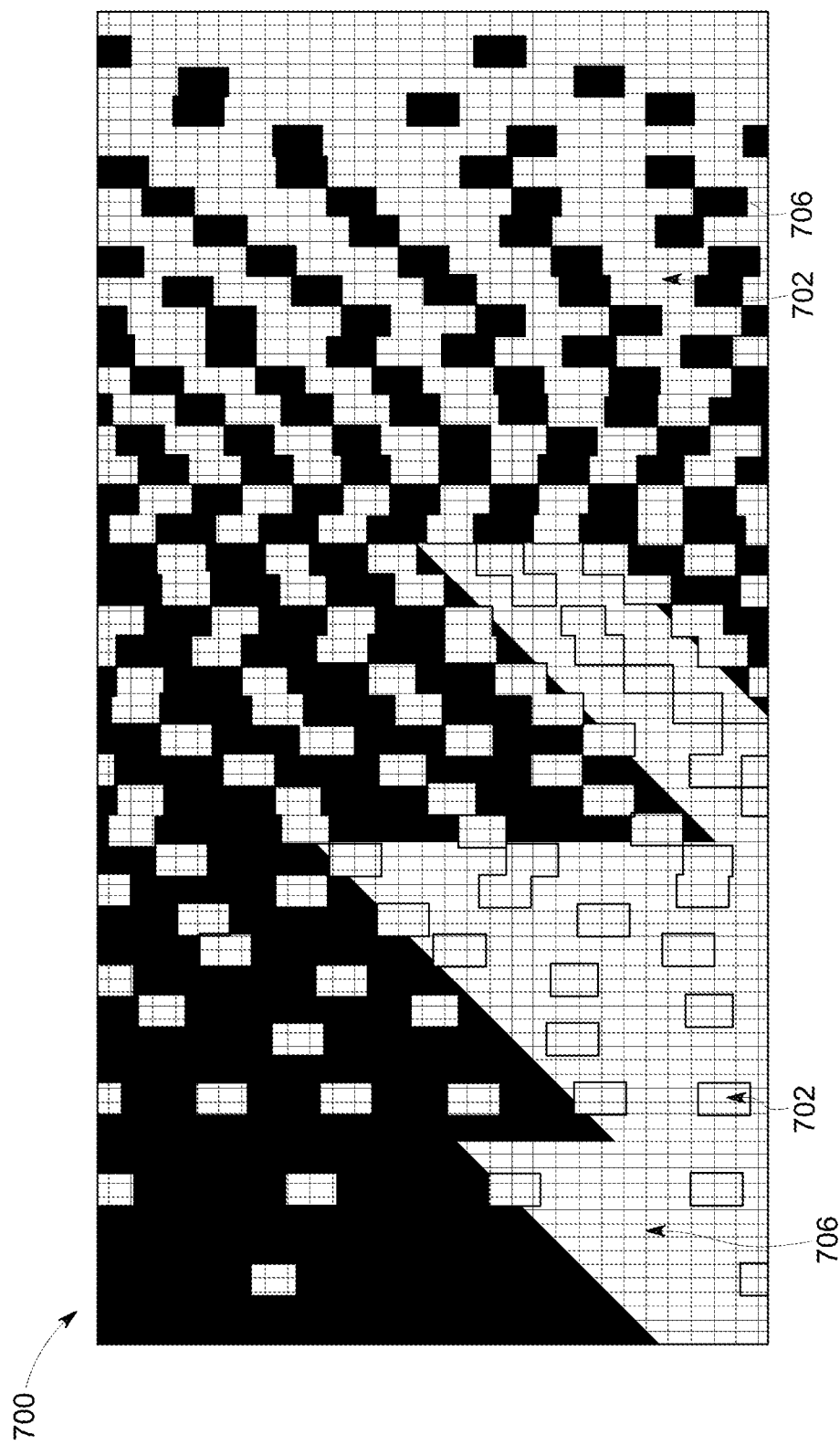
FIG. 7 illustrates a top-down view of an embodiment of the termination region depicted in FIGS. 2 and 3 in accordance with some embodiments of the present invention.

FIG. 7 is an example of top-down image of a portion of termination region 700 in accordance with some embodiments of the present invention. In the embodiment shown, the termination region 700 is graded (e.g., laterally varying the percentage of implanted percentage of the top-down layout) and segmented (e.g., as described above with respect to FIG. 3). In such embodiments, the termination region 700 may include p-type areas 706 (e.g., p-type areas formed via local doping e.g. implantation or diffusion, as in FIG. 3, region 321)) and n-type areas 702 (e.g., n-type areas formed via, fabrication of the second layer 222, 338 described above). The p-type areas 706 may include a dopant profile such as those described above with respect to FIGS. 5 and 6. The n-type areas 702 may include a dopant profile such as those described above with respect to FIGS. 4-6. In some embodiments wherein the first layer may be of p-type, the termination region 700 shown in FIG. 7 may be such that the implanted regions 706 may be n-type and the areas 702 may be doped p-type as the second layer 222, 338.

The inventors have observed that utilizing a segmented and laterally graded termination region provides a comparatively high blocking voltage via a compensating (e.g., the n-type 702) doping that exceeds a local background doping concentration (e.g., second layer 238, 318) by up to, about four (4) times. In some embodiments, the termination region 700 may maintain a comparable blocking voltage as uncompensated termination (>90% 1D limit) with an additional, for example, about 30%, compensated dose (e.g., about $3 \times 10^{12}$ $cm^{-2}$ to about $4 \times 10^{12}$ $cm^{-2}$).

Figure 8:
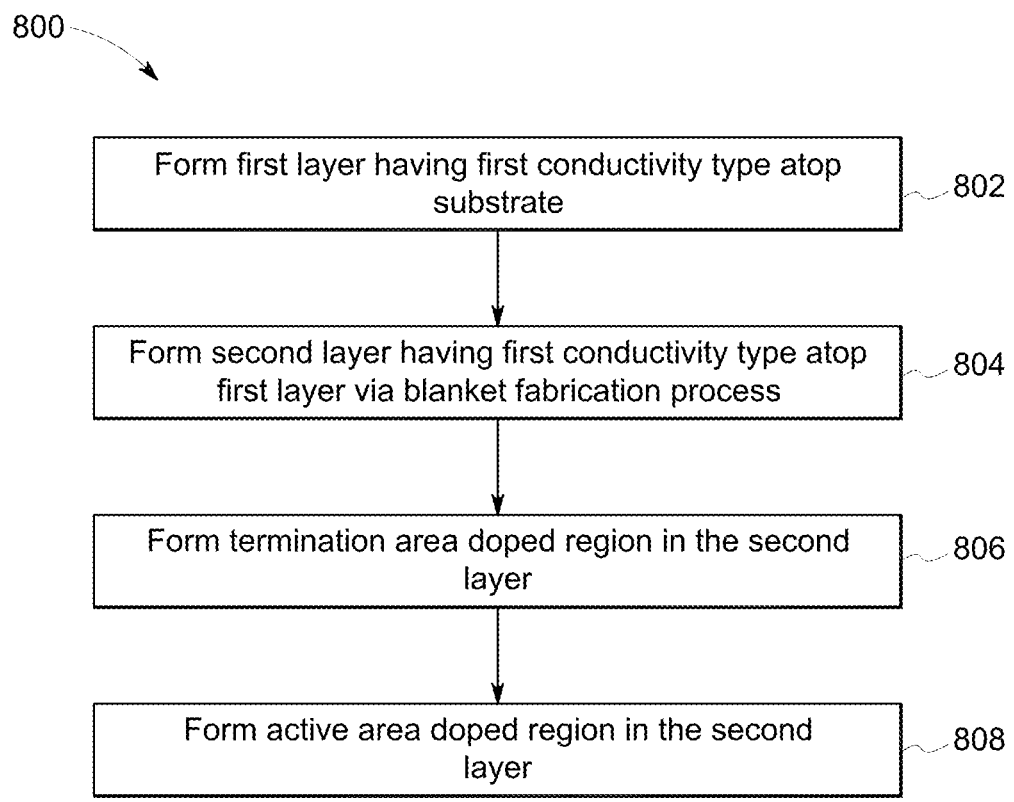
FIG. 8 depicts a method for forming a semiconductor device in accordance with some embodiments of the present invention.

FIG. 8 depicts a method 800 for fabricating a semiconductor device in accordance with some embodiments of the present invention.

The method begins at 802, where a first layer having a first conductivity type (e.g., n-type or p-type) is formed atop a substrate. The substrate may be any type of substrate, for example such as the substrate 242, 302 described above. The first layer may be any type of layer, for example such as the first layer 234, 314 described above and formed via any suitable fabrication process, for example deposition, epitaxial growth, or the like.

Next, at 804, a second layer having a first conductivity type is formed atop the first layer via a blanket fabrication process. The blanket fabrication process may be any type of growth, deposition, implantation, diffusion doping process or the like that allows for the formation of the second layer in fully covering atop the first layer and thickness without the use of etch or patterning masks, subsequent etch processes related to such masks, or the like.

The second layer may be any type of layer, for example, such as the second layer 238, 318 described above. In addition, the second layer may have a conductivity type (e.g., n-type or p-type) the same as that of the first layer. In such embodiments, the second layer may have a total or effective dopant concentration higher than that of the first layer. In some embodiments, the second layer may include a dopant profile similar to the dopant profiles 402, 502, 602 described above.

Next, at 806, a termination area doped region is formed in the second layer. The termination area doped region may be any type of region suitable to form at least a portion of a suitable termination region and may include any suitable termination structure, for example, such as described above with respect to termination region 320, 233. In addition, the termination region may have a conductivity type (e.g., n-type or p-type) opposite that of the first layer and second layer. In some embodiments, the termination region may include a dopant profile similar to the dopant profiles 522, 524 described above.

Next, at 808, an active area doped region is formed in the second layer. The active area doped region may be any type of region suitable to form at least a portion of a suitable device active region and may include any suitable device structures (e.g. MOSFET, JFET, IGBT, JBS, etc), for example, such as described above with respect to the active area (region) 232, 336. In addition, the active area doped regions may have a conductivity type (e.g., n-type or p-type) opposite that of the first layer and second layer. In some embodiments, the active region may include a dopant profiles similar to any of the dopant profiles described above (eg 522, 524).

After the active area doped region is formed at 808, the method generally ends and the semiconductor device may proceed to other fabrication processes or steps suitable to provide a fully or at least partially fabricated device.

Although shown in FIG. 8 in a particular sequence, each process step may occur in any order, simultaneously or at overlapping intervals suitable to fabricate a desired device. For example, the formation of the active region at 808 may occur before, after or simultaneously with the formation of the termination region 806.

Therefore, embodiments of a semiconductor device and methods of forming thereof are provided herein. In at least some embodiments, the foregoing device and methods may provide a semiconductor device having improved performance characteristics while allowing for a comparatively simpler fabrication process.

This written description uses examples to explain the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A silicon carbide (SiC) field effect transistor (FET) comprising:
   a first layer having a first conductivity type that forms a drift region of the SiC FET;
   a second layer disposed directly atop the first layer, the second layer having the first conductivity type;
   a laterally graded and segmented termination region formed in the second layer, the termination region having a second conductivity type opposite the first type; and
   an active region at least partially formed in the second layer, wherein the active region comprises second layer dopant concentration that increases by at least five (5) times from a surface of the active region to a depth at which a peak dopant concentration is disposed, wherein the active region comprises a well region that is contiguous with a first lateral side of the termination region, and wherein the second layer is contiguous with a second lateral side of the termination region opposite the first side.

2. The SiC FET of claim 1, wherein an average dopant concentration of the second layer is greater than an average dopant concentration of the first layer.

3. The SiC FET of claim 1, where the second layer extends entirely across the first layer of the SiC FET.

4. The SiC FET of claim 1, wherein the well region of the active region comprises a body region.

5. The SiC FET of claim 1, wherein a substrate disposed beneath the first layer comprises silicon carbide (SiC).

6. The SiC FET of claim 1, wherein an average dopant concentration of the second layer is between about two (2) times to about fifteen (15) times greater than that of the first layer.

7. The SiC FET of claim 1, wherein a dopant concentration profile within the second layer as measured from a surface of the second layer to a first depth of the second layer comprises a retrograde profile.

8. The SiC FET of claim 7, wherein an average dopant concentration at a depth of at least 0.2 μm from a surface of the second layer is at least four (4) times greater than that of an average dopant concentration at the surface of the second layer.

9. The SiC FET of claim 7, wherein an average dopant concentration at the surface of the second layer is up to about $1 \times 10^{16}$ cm$^{-3}$.

10. The SiC FET of claim 7, wherein a sheet doping concentration of dopants within an area defined as between the surface of the second layer to a depth of about 1.5 μm is between about $2 \times 10^{12}$ cm$^{-2}$ to about $5 \times 10^{12}$ cm$^{-2}$.

11. The SiC FET of claim 7, wherein a dopant concentration of the second layer is less than about 20% of a dopant concentration of the well region of the active area at substantially similar depths into the second layer and well region until a depth of about 0.15 um to 0.3 um from the surface of the second layer.

12. The SiC FET of claim 7, wherein a dopant concentration profile of a sheet doping concentration within the termination region as measured from a surface of the termination region to the first depth of the termination region comprises a retrograde profile or a box-like profile, and wherein a peak dopant concentration of the termination region is greater than a peak dopant concentration of the second layer.

13. The SiC FET of claim 1, wherein the termination region comprises one or more of a segmented termination region, a multi-zoned junction termination extension, a continuous junction termination extension, and one or more guard rings.

14. The SiC FET of claim 1, wherein the first layer is a first SiC epitaxial (epi) layer and the second layer is a second SiC epi layer disposed directly atop the first SiC epi layer.

15. The SiC FET of claim 1, wherein the first layer is a first SiC epitaxial (epi) layer and the second layer is a doped region disposed directly adjacent to a top surface of the first SiC epi layer.

16. A field effect transistor (FET) semiconductor device, comprising:
   a first layer having a first conductivity type that forms a drift region of the FET semiconductor device;
   a second layer disposed directly atop the first layer, the second layer having the first conductivity type, wherein a dopant concentration profile of an average dopant concentration within the second layer as measured from a surface of the second layer to a first depth of the second layer comprises a retrograde profile;

a laterally graded and segmented termination region formed in the second layer, the termination region having a second conductivity type opposite the first type, wherein the average dopant concentration of the second layer is greater than an average dopant concentration of the first layer; and an active region at least partially formed in the second layer, wherein the active region comprises a well region that is contiguous with a first lateral side of the termination region and wherein the second layer is contiguous with a second lateral side of the termination region opposite the first side.

17. The FET semiconductor device of claim 16, wherein the first layer, the second layer, and a substrate disposed beneath the first layer comprises silicon carbide (SiC).

18. The FET semiconductor device of claim 16, wherein the average dopant concentration at a depth of at least 0.2 um from the surface of the second layer is at least four (4) times greater than that of an average dopant concentration at the surface of the second layer.

19. The FET semiconductor device of claim 16, wherein the average dopant concentration at the surface of the second layer is up to about $1 \times 10^{16}$ cm$^{-3}$.

20. The FET semiconductor device of claim 16, wherein a sheet doping concentration of dopants within an area defined as between the surface of second layer to a depth of about 1.5 μm is between about $2 \times 10^{12}$ cm$^{-2}$ to about $5 \times 10^{12}$ cm$^{-2}$.

21. The FET semiconductor device of claim 16, wherein a dopant concentration of the second layer is less than about 20% of a dopant concentration of a well region formed in the active region at substantially similar depths into the second layer and well region until a depth of about 0.15 um to 0.3 um from the surface of the second layer.

22. The FET semiconductor device of claim 16, wherein a dopant concentration profile of an average dopant concentration within the termination region as measured from a surface of the termination region to a second depth of the termination region comprises a retrograde profile or a box-like profile, and wherein a peak dopant concentration of the termination region is greater than a peak dopant concentration of the second layer.

23. The FET semiconductor device of claim 16, wherein the active region comprises a dopant concentration that increases by at least five (5) times from a surface of the active region to a depth at which a peak concentration is disposed.

24. A silicon carbide (SiC) field effect transistor (FET) device comprising:

a first layer having a first conductivity type that forms a drift region of the SiC FET device;

a second layer disposed directly atop the first layer, the second layer having the first conductivity type, wherein a dopant concentration profile of an average dopant concentration within the second layer as measured from a surface of the second layer to a first depth of the second layer comprises a retrograde profile;

a termination region formed in the second layer, the termination region having a second conductivity type opposite the first type; and an active region at least partially formed in the second layer, wherein the active region comprises a well region that is contiguous with a first lateral side of the termination region, and wherein the second layer is contiguous with a second lateral side of the termination region opposite the first side.

25. The FET device of claim 24, wherein the active region comprises second layer dopant concentration that increases by at least five (5) times from a surface of the active region to a depth at which a peak dopant concentration is disposed.

26. The FET device of claim 24, wherein an average dopant concentration of the second layer is between about two (2) times to about fifteen (15) times greater than that of the first layer.

27. The FET device of claim 24, wherein the termination region comprises a laterally graded and segmented termination region.

28. The FET device of claim 24, wherein the average dopant concentration at a depth of at least 0.2 μm from the surface of the second layer is at least four (4) times greater than that of an average dopant concentration at the surface of the second layer.

* * * * *